United States Patent [19]
Davenport

[11] Patent Number: 5,432,393
[45] Date of Patent: Jul. 11, 1995

[54] SURFACE ACOUSTIC WAVE DEVICE

[75] Inventor: Roger A. Davenport, Ft. Lauderdale, Fla.

[73] Assignee: Motorola, Inc., Schaumburg, Ill.

[21] Appl. No.: 305,858

[22] Filed: Sep. 14, 1994

Related U.S. Application Data

[63] Continuation of Ser. No. 85,893, Jul. 6, 1993, abandoned.

[51] Int. Cl.6 .................................. H01L 41/08
[52] U.S. Cl. .............................. 310/313 B; 333/193
[58] Field of Search .............. 310/313 B, 313 R; 333/150, 154, 193, 196

[56] References Cited

U.S. PATENT DOCUMENTS

| | | | |
|---|---|---|---|
| 2,540,412 | 2/1951 | Adler | 333/150 |
| 3,689,784 | 9/1972 | DeKlerk | 310/313 B |
| 3,737,811 | 6/1973 | Paige | 333/154 |
| 3,760,204 | 9/1973 | Yester, Jr. | 310/313 B |
| 3,825,779 | 7/1974 | DeKlerk | 310/313 B |
| 3,970,970 | 7/1976 | Worley | 333/195 |
| 4,409,567 | 10/1983 | Setsune et al. | 333/154 |
| 4,422,055 | 12/1983 | Cullen et al. | 333/151 |
| 4,491,811 | 1/1985 | Niitsuma et al. | 333/154 |
| 5,323,636 | 6/1994 | McGowan et al. | 310/313 R |

*Primary Examiner*—Thomas M. Dougherty
*Attorney, Agent, or Firm*—Pedro P. Hernandez; Andrew S. Fuller

[57] ABSTRACT

A includes a non-piezoelectric substrate and a piezoelectric substrate (206) having matched transducers on both opposed surfaces of the piezoelectric substrate (206). The matched transducers being 180 degrees out of phase from one another. The present invention provides for improved coupling due to the new SAW the multilayer transducer topology.

6 Claims, 5 Drawing Sheets

SURFACE ACOUSTIC WAVE DEVICE

This is a continuation of application No. 08/085,893, filed Jul. 6, 1993 and now abandoned.

TECHNICAL FIELD

This invention relates in general to surface acoustic wave devices (SAWs) and in particular to a SAW architecture which provides for enhanced coupling.

BACKGROUND

SAW devices are preferred over widely used transmission line components because acoustic waves have a substantially shorter wave length at their operating frequency than those of electromagnetic waves which travel at the speed of light. Therefore, for a given operating frequency, a SAW resonator filter provides a smaller sized structure than a transmission line, making them suitable for miniaturized radio frequency applications. For the above reasons, the popularity of SAW structures in radio frequency applications, especially in resonator filter applications has been steadily increasing.

A lot of effort is being exerted in the field of SAW devices in developing higher coupling coefficient materials for the use in SAW devices. The higher coupling materials can be utilized in designing SAW devices having higher performance specifications. In particular, SAW resonators can be designed having wider bandwidth and lower insertion loss in smaller sizes, as higher coupling coefficient materials are developed. A need thus exists for a SAW device which can provide for increased coupling while using the same piezoelectric material.

SUMMARY OF THE INVENTION

Briefly, according to the invention, there is provided a surface acoustic wave (SAW) filter having a multi-layer transducer topology which provides for enhanced coefficient of coupling. A first transducer is located on one side of a piezoelectric substrate, while a second transducer is located on the other side of the piezoelectric substrate. The interdigits of the first and second transducers are in substantial registration with each other. The present topology increases the coupling coefficient of present SAW devices without changing the piezoelectric material being used in the SAW device.

DETAILED DESCRIPTION OF THE PREFERRED EMBODIMENT

Figure 1:
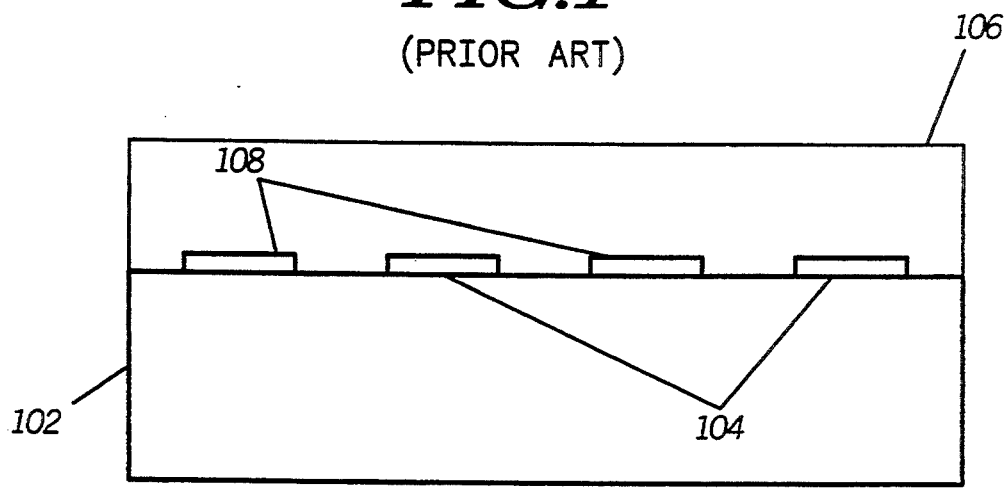
FIG. 1 is a cross-sectional view of a prior art SAW device.

Film SAW devices typically have a cross sectional topology as shown in FIG. 1. The non-piezoelectric substrate 102 has a patterned (interdigit) metallization layer 104 and 108 which is covered with a piezoelectric film 106. The surface wave is created by the array of opposing electric fields between adjacent fingers 104 and 108 which create alternating dilations and compressions in the surface of the piezoelectric film 106. A "surface" is defined as the contact point between two rarefied mediums which does not necessarily imply the top surface only. Realizing the piezoelectric film has two surfaces that SAWs travel on, and also understanding wave particle movements relationships, a more efficient multi-layer transducer can be designed.

Figure 2:
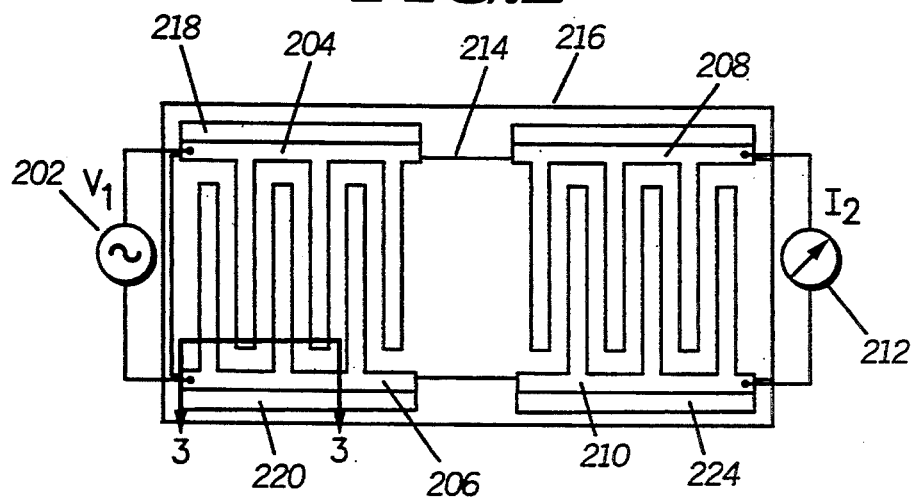
FIG. 2 is a top view of a SAW device in accordance with the present invention.

In FIG. 2, a top view of a typical SAW device in accordance with the present invention is shown. An interdigital transducer (IDT) consists of a metallic pattern of interdigitated electrodes fabricated on a polished surface of a piezoelectric film (substrate) using photolithographic techniques. The embodiment shown in FIG. 2 forms a complete delay line consisting of two IDTs, one acting as a transmitter formed by electrodes 204 and 206, and one acting as a receiver formed by electrodes 208 and 210. Although the present invention will be described with this specific transversal filter design, any type of SAW design can benefit from the present invention as will be described below.

Input signal source 202 provides an input signal to the transmitter side transducer formed by electrodes 204 and 206, which is subsequently received at the receiver side transducer formed by electrodes 208 and 210. A voltage designated as $V_1$ applied at the input side generates a SAW beam with an amplitude propagating in both directions, the portion moving to the right moves towards the receiver side. The SAW beam generates a short-circuit current $I_2$ 212. Electrodes 204–210 are formed on piezoelectric film 214 which is attached to non-piezoelectric substrate 216. A second set of transducers formed by electrodes 218 and 220 and 222 and 224, are located underneath the piezoelectric substrate 208 on substrate 216 and are electrically coupled to their respective "top" transducers. The bottom set of transducers as will be shown later are aligned to the top set of transducers and are electrically coupled so that they are substantially 180 degrees out of phase with respect to the top set of transducers. For example, electrode 204 is electrically coupled to bottom electrode 218 by the fact that a portion of electrode 204 is formed past piezoelectric film 214 and is metallized on top of electrode 218. The other "top" electrodes in FIG. 2 are electrically coupled to their respective "bottom" electrodes.

Figure 3:
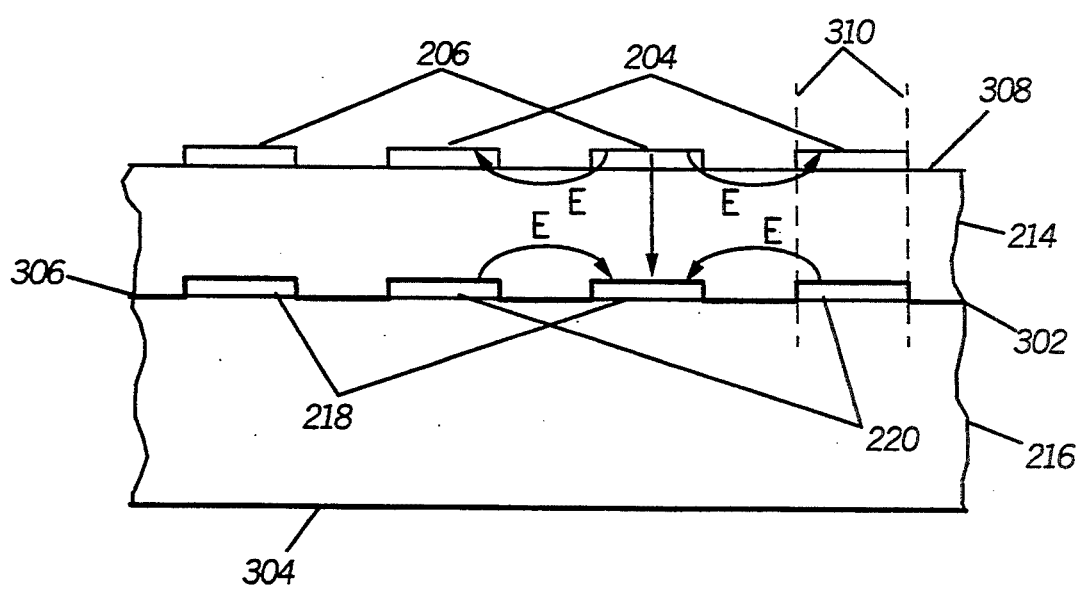
FIG. 3 is a partial cross-sectional view of the SAW device of FIG. 2 taken along line 3—3.

Referring now to FIG. 3, a partial cross-sectional view of the SAW device of FIG. 2 taken along line 3—3 in accordance with the present invention is shown. The present invention uses a multi-layer set of transducers which consists of matched IDTs located on both surfaces of piezoelectric film 214. The transducers are designed such that they operate 180° out of phase with respect to each other. The partial cross section (showing the transmitter side of the SAW of FIG. 2) shows the first (top) transducer which is formed by electrodes or electrodes 204 and 206, while a second (bottom) transducer is formed from electrodes and 218 and 220. The first transducer is located on the first surface 308 of piezoelectric film 214, while the second transducer which is metallized on first surface 306 of non-piezoelectric substrate 216. The typical steps in the fabrication of the SAW device include: metallizing electrodes 218 and 220 onto non-piezoelectric substrate 216; placing the piezoelectric film 214 on non-piezoelectric substrate 216; and metallizing electrodes 204 and 206 onto the piezoelectric film 214.

Piezoelectric film 214 can be manufactured from a number of materials such as zinc oxide, aluminum nitride etc. In the preferred embodiment, piezoelectric film 214 has a width of approximately between half of the desired wavelength to a wavelength of the design of surface velocity ($\lambda X/2 - \lambda$). While non-piezoelectric substrate 216 can be made from silicon or other non-piezoelectric materials used in SAW designs.

Second surface 302 of piezoelectric substrate 214 is coupled to first surface 306 of non-piezoelectric substrate 216. Both the first and second transducers are in substantial registration (alignment) with respect with each other as shown by lines 310. The amount that the interdigits of each of the transducers can be "off registration" (shifted to the right or to the left) with respect to each other and still provide for enhanced coupling to the SAW will depend on the crystal lattice structure and grain growth of the piezoelectric material being used. Since the crystal lattice structure and grain growth of the piezoelectric material being used will have an effect on the E field interaction between the top and bottom transducers, and thus will have an effect on the total amount of increased coupling achieved.

The primary strain from an IDT on a particular surface results from the strong electric field close to the surface between the electrodes. The strain or particle displacement can be increased with a design which utilizes in phase stresses from different sources as done by the design of the present invention. The increased efficiency of the present invention as shown in FIG. 3 (the arrows marked E, showing the electrical field on one set of fingers) is due to the addition of 2 aggregate forces which are related to the electric field terms which the prior art single layer IDT does not use. The two forces being:

1. Additive force from horizontal phase reversed particle movements with respect to depth from surface and the already in phase vertical particle movement; and
2. Additive surface strain from shear bulk modes.

The increased strain is linearly proportional to the electric field which the surface wave can transfer as long as it does not exceed the linear range of the elastic constants of the material. The multi-layer electrodes can create additive forces in launching and receiving surface acoustic waves.

Figure 4:
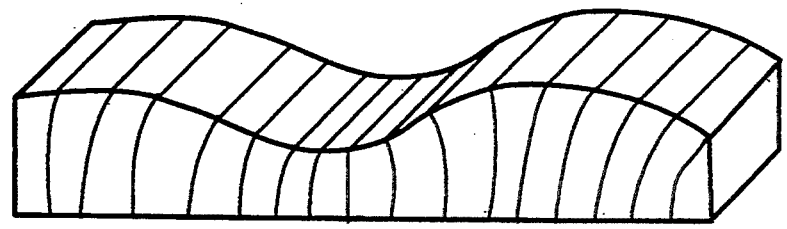
FIG. 4 is a prior art Rayleigh diagram showing vertical and horizontal particle movement.

To understand how this works, first look at the particle movement of a single surface wave of the Rayleigh variety as shown in FIG. 4. Rayleigh surface waves particles move both in the direction of wave propagation and perpendicular to the depth so that the wave has mixed compressional and shear characteristics. Both the vertical and horizontal motions are caused by a dilation or compression which results from the E fields in the piezoelectric material. An E field in one direction will cause a dilation while the E field in the opposite direction will cause a compression. Because of these alternating dilation and compressional forces the material will bow either inward or outward relating the horizontal movement to the vertical movement.

Figure 5:
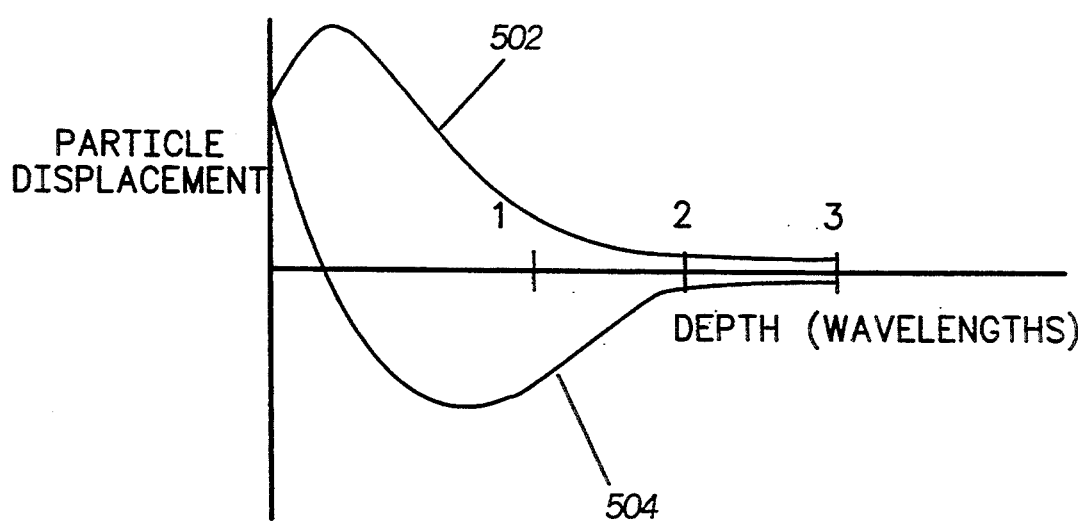
FIG. 5 is a diagram showing the particle movement characterization of a typical SAW device.

In FIG. 5, the phase relationship of particle movement is shown. This phase relationship helps explain the first additional force discussed above. With respect to depth, the vertical particle movement shown in graph 502 stays in phase with surface particle movement, however, the in-line propagation (horizontal) particle movement 504 goes through a zero movement transition at a depth of approximately 0.3 to 0.4$\delta$ and then into a phase reversal. The reversed particle movement amplitude increases which is maximum at approximately 0.7 to 1.0$\delta$, as shown in FIG. 5.

Figure 6:
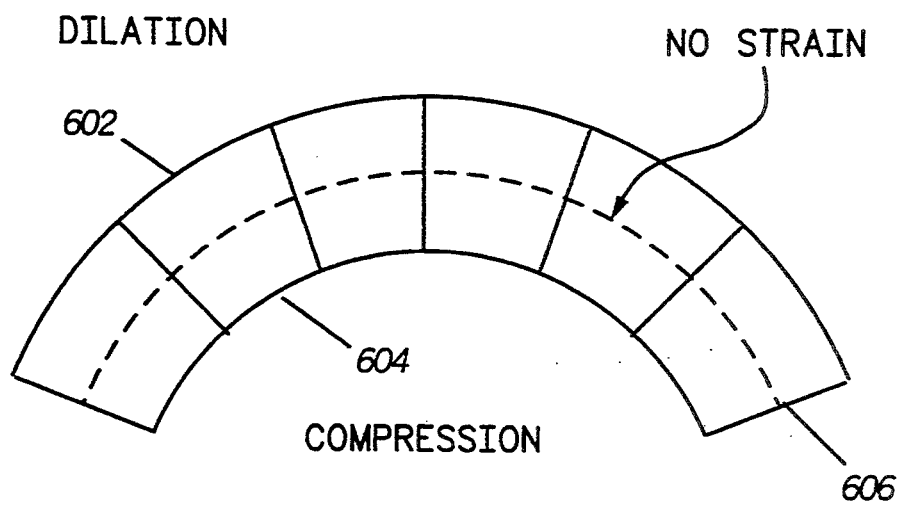
FIG. 6 is a prior art drawing of the strain relationship caused by bending a thin material.

This phase is easily understood by examining the strains of a simple rod 600 being bent, as shown in FIG. 6. The top side 602 is a dilation, the center of the rod 606 is strain free, and the underside 604 is in compression. The multiple layer IDT 200 of the present invention uses the primary strains from each surface's IDT and the vertical and horizontal strain relations, to increase efficiency. This is done by fabricating IDT metallization patterns on each surface 180 degrees out of phase. The initial forces on one surface will also enhance the strain on the opposing surface with an additive effect to its own primary deformation. This additive effect increases the amplitude of the particle displacement and hence the coupling coefficient of the SAW device.

The second additional additive strain mechanism for increasing particle movement is the effect of the shear bulk mode. Since the electrodes are vertically aligned on the opposing surfaces (in substantial registration with each other), and are 180° out of phase with respect to the signal polarity, bulk mode is generated. The bulk shear mode may be used to further enhance the dilation and compression areas on the surface.

Figure 7:
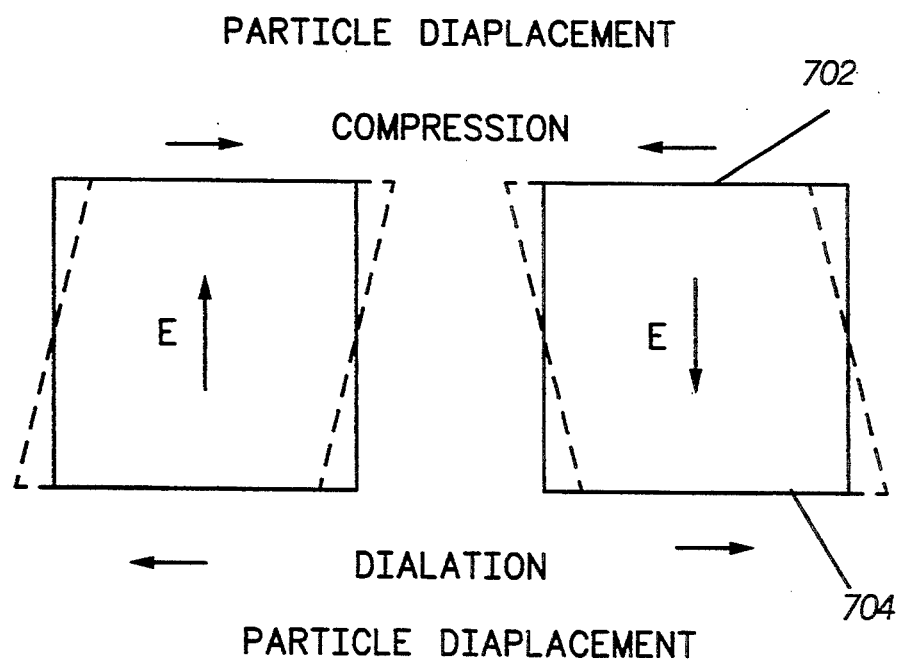
FIG. 7 is a prior art drawing showing shear mode strain.

The bulk shear mode previously discussed, has particle movement as shown in FIG. 7. If the E field is passing through the bulk as shown, the top surface 702 will shift off in one direction and the bottom surface 704 will shift in the opposite direction. These horizontal shifts can intensify the overall particle movement of the surface wave. Since the piezoelectric film thickness can typically be in the range of 0.3 and 1$\delta$ this is a reasonable thickness to get the bulk resonance to the same frequency as the SAW resonance.

The amount of increased overall coupling that the present invention's multi-layer IDT will have over a conventional film IDT will vary depending on the materials crystal lattice structure, the piezoelectric strain constants, the dielectric value and elastic constants used in designing the SAW device. These properties will control individual coupling of the different modes which will add up to the total coupling gain achieved.

Figure 8:
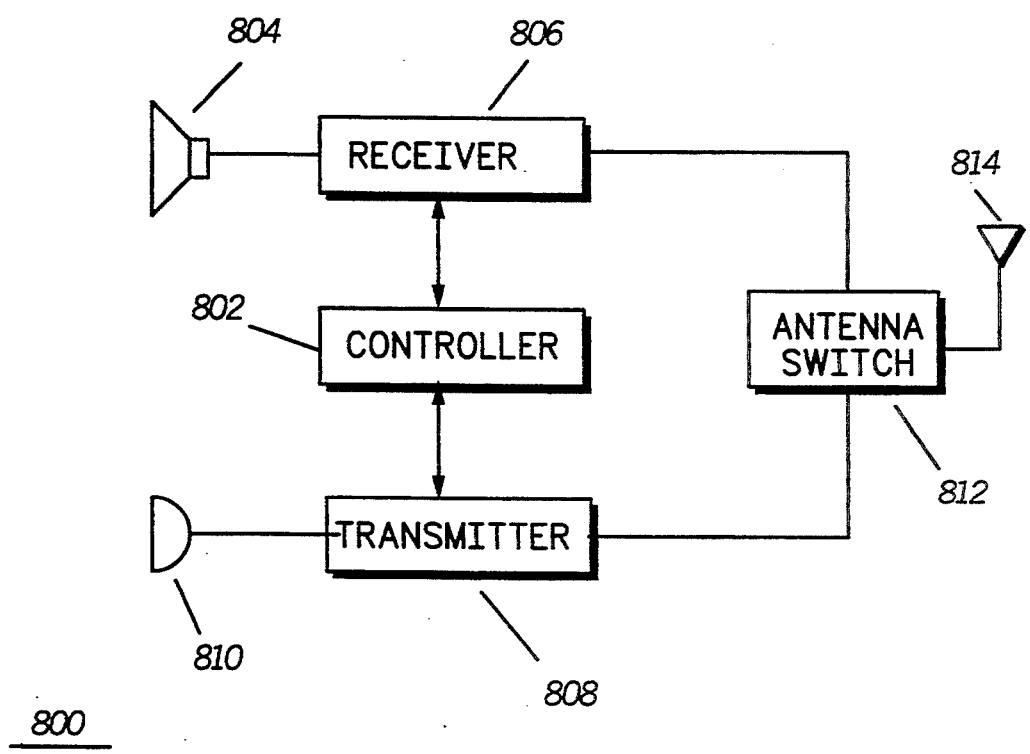
FIG. 8 is a block diagram of a radio in accordance with the present invention.

Referring now to FIG. 8, a block diagram of a communication device such as a FM two-way radio 800 which uses the SAW device of the present invention is shown. Radio 800 comprises a transmitter 808 and receiver 808 which are selectively coupled to antenna 814 via antenna switch 812 which can take the form of a conventional antenna switch or a duplexer. Receiver 806 and transmitter 808 are under the control of controller 802 which is preferably a microprocessor such as a MC68HC11 manufactured by Motorola, Inc. Controller 802 runs appropriate control software stored and executed by controller 802.

A speaker 804 is coupled to receiver 806 in order to provide for audio to presented to the radio user. While a microphone 810 is coupled to transmitter 808 in order to convert the users voice into electrical signals usable to transmitter 808. The present invention contemplates utilizing SAW technology for the processing of communication signals. The processing of the communication signals includes performing such functions as frequency filtering, phase splitting and transformation.

In receiver 806, a radio frequency (RF) signal carrying a message is received by antenna 814. The RF signal is then sent to receiver 806 for processing. In receiver 806, the received signal is applied to a filter (not shown) which comprises a SAW bandpass filter utilizing the topology of the present invention in order to provide the initial selectivity for receiver 806. Other areas in which the SAW device of the present invention can be used in include but are not limited to, the IF stage of receiver 806 both for use in designing the transformers and mixers for the stage, and other stages of radio 800 in which voltage-controlled oscillators (VCOs), filters, etc. are needed.

Figure 9:
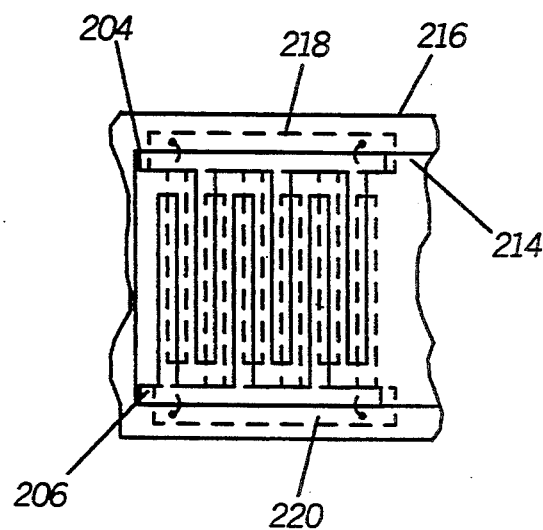
FIG. 9 is a top view of one embodiment of the present invention showing the bottom electrodes "off" registration for illustration purposes.

In FIG. 9, a partial top view of the multilayer transducer of the present invention is shown. The lower transducer formed by electrodes 218 and 220 is shown using dashed lines in order to better illustrate the present invention. Electrodes 218 and 220 are metallized onto non-piezoelectric substrate 216. The upper transducer formed by electrodes 204 and 206 is shown formed on the top surface of piezoelectric film 214. Bottom electrodes 218 and 220 are electrically coupled to top transducer electrodes 204 and 206 respectively using wire-bonds or other well known electrical interconnection techniques. The upper and lower transducers are shown in FIG. 9 "off registered" (shifted) with respect to each other in order to better illustrate the present invention.

In the preferred embodiment, the two transducers would be as closely registered (aligned to each other when viewed from the top, see lines 310 in FIG. 3) with respect to each other as possible in order to get the maximum coupling benefits from the invention. The shift in the registration of the two transducers is only used in FIG. 9 to better illustrate how the 180 degree out of phase relationship between the top and bottom transducers is achieved, as well to better illustrate the overall structure of the multi-layer transducers. Preferably the bottom two electrodes 218 and 220 extend further from the sides than the top electrodes in order to provide for ease of electrical interconnection between the multi-layer transducers. In FIG. 9, the top electrodes 204 and 206 do not extend over piezoelectric film 214 and are electrically coupled to bottom electrodes 218 and 220 using a plurality of wirebonds, this can be compared to FIG. 2 where the top and bottom electrodes where interconnected by overlapping the metallization of the top electrodes onto the bottom electrodes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, the present invention can be used in any SAW design, by using the multi-layer transducer architecture of the present invention. Furthermore, the present multi-layer design is also not limited to two layers.

In summary, the present invention provides for improved coupling by using a set of transducers which are located in substantial registration with each other on the opposed surfaces of the piezoelectric film, and the transducers being coupled so that they are substantially 180 degrees out of phase with respect to each other. The invention provides

What is claimed is:

1. A surface acoustic wave (SAW) device, comprising:
a piezoelectric film having first and second surfaces;
a multilevel interdigital transducer disposed on the piezoelectric film, the multilevel interdigital transducer having first and second electrodes which are not electrically interconnected to each other; and
the first and second electrodes have interdigitated fingers on the first and second surfaces of the piezoelectric film and the fingers of the first electrode located on the first surface of the piezoelectric film are substantially in register with the fingers of the second electrode located on the second surface of the piezoeletric film, and the fingers of the second electrode located on the first surface of the piezoelectric film are substantially in register with the fingers of the first electrode located on the second surface of the piezoelectric film.

2. A surface acoustic wave device as defined in claim 1, further comprising:
a signal source having first and second output terminals for applying an electric signal operating at a given frequency, the first output terminal is electrically coupled to the first electrode and the second output terminal is coupled to the second electrode.

3. A surface acoustic wave device as defined in claim 1, wherein the piezoelectric substrate has a thickness of substantially one half wavelength (δ/2) of the given operating frequency.

4. A surface acoustic wave device as defined in claim 1, wherein the fingers located on the first and second surfaces of the first electrode are wire bonded together and the fingers located on the first and second surfaces of the second electrode are wire bonded together.

5. A surface acoustic wave (SAW) device, comprising:
a non-piezoelectric substrate having first and second surfaces;
a piezoelectric film having first and second surfaces and the second surface of the piezoelectric film is attached to the first surface of the nonpiezoelectric substrate;
a multilevel interdigital transducer disposed on the piezoelectric substrate, the interdigital transducer including first and second electrodes which are not electrically interconnected to each other, the first and second electrodes having interdigitating fingers on both the first and second surfaces of the piezoelectric substrate with the adjacent fingers on both the first and second surfaces of the piezoelectric substrate alternating between the first and second electrodes and the interdigitating fingers on both the first and second surfaces overlay each other such that the fingers of the first electrode located on the first surface of the piezoelectric film are substantially in register with the fingers of the second electrode located on the second surface of the piezoelectric film, and the fingers of the second electrode located on the first surface of the piezoelectric film are substantially in register with the fingers of the first electrode located on the second surface of the piezoelectric film.

6. A surface acoustic wave (SAW) device, comprising:
- a non-piezoelectric substrate having first and second surfaces:
- a piezoelectric substrate having first and second surfaces and the second surface of the piezoelectric substrate is attached to the first surface of the non-piezoelectric substrate;
- an interdigital transducer disposed on the piezoelectric substrate, the interdigital transducer including first and second electrically opposite electrodes having interdigitating fingers on both the first and second surfaces of the piezoelectric substrate with the adjacent fingers on both the first and second surfaces of the piezoelectric substrate alternating between the first and second electrically opposite electrodes and the interdigitating fingers on both the first and second surfaces overlay each other such that the rinsers of the first electrode located on the first surface of the piezoelectric film are substantially in register with the interdigitated fingers of the second electrode located on the second surface of the piezoelectric film, and the interdigitated fingers of the second electrode located on the first surface of the piezoelectric film are substantially in register with the interdigitated fingers of the first electrode located on the second surface of the piezoelectric film; and
- a signal source applying an electric signal operating at a given frequency between the first and second electrically opposite electrodes the electric signal generating a 180 degree acoustic phase shift between the adjacent interdigitating fingers on both the first and second surfaces and between the overlaying fingers located on the first and second surfaces.

* * * * *

UNITED STATES PATENT AND TRADEMARK OFFICE
CERTIFICATE OF CORRECTION

PATENT NO. : 5,432,393
DATED : July 11, 1995
INVENTOR(S) : Roger A. Davenport

It is certified that error appears in the above-indentified patent and that said Letters Patent is hereby corrected as shown below:

In the Claims

Column 8

Line 1

Delete --rinsers-- and insert --fingers--

Signed and Sealed this

Fourteenth Day of November, 1995

Attest:

BRUCE LEHMAN

Attesting Officer

Commissioner of Patents and Trademarks